United States Patent
Doany et al.

(10) Patent No.: US 8,265,432 B2
(45) Date of Patent: Sep. 11, 2012

(54) OPTICAL TRANSCEIVER MODULE WITH OPTICAL WINDOWS

(75) Inventors: Fuad Elias Doany, Katonah, NY (US); Clint Lee Schow, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/045,186

(22) Filed: Mar. 10, 2008

(65) Prior Publication Data
US 2009/0226130 A1  Sep. 10, 2009

(51) Int. Cl.
- *G02B 6/12* (2006.01)
- *G02B 6/36* (2006.01)
- *G02B 6/10* (2006.01)
- *H01L 31/0232* (2006.01)
- *H01L 31/0203* (2006.01)
- *H01L 23/02* (2006.01)

(52) U.S. Cl. ............ 385/14; 385/88; 385/129; 257/432; 257/434; 257/680

(58) Field of Classification Search .................... 385/14, 385/24, 33, 52, 88, 89, 92–94, 129–131; 257/98, 431–434, 680
See application file for complete search history.

(56) References Cited

U.S. PATENT DOCUMENTS

| | | | |
|---|---|---|---|
| 5,200,631 A * | 4/1993 | Austin et al. ................. | 257/570 |
| 6,477,286 B1 | 11/2002 | Ouchi | |
| 6,538,312 B1 | 3/2003 | Peterson et al. | |
| 6,558,976 B2 | 5/2003 | Shrauger | |
| 6,843,608 B2 | 1/2005 | O'Connor et al. | |
| 6,910,812 B2 | 6/2005 | Pommer et al. | |
| 6,953,291 B2 | 10/2005 | Liu | |
| 6,955,934 B2 | 10/2005 | Gallup et al. | |
| 7,062,144 B2 * | 6/2006 | Hwang et al. ................. | 385/139 |
| 7,116,912 B2 * | 10/2006 | Pang et al. ................... | 398/139 |
| 7,192,200 B2 | 3/2007 | Casati et al. | |
| 7,263,248 B2 * | 8/2007 | Windover ...................... | 385/14 |
| 7,306,378 B2 * | 12/2007 | Alduino et al. ................. | 385/88 |
| RE40,154 E * | 3/2008 | Ishibashi et al. ................ | 385/92 |
| 2002/0071641 A1 * | 6/2002 | Nakanishi et al. ............. | 385/88 |
| 2002/0196997 A1 * | 12/2002 | Chakravorty et al. .......... | 385/14 |
| 2003/0002770 A1 * | 1/2003 | Chakravorty et al. .......... | 385/14 |
| 2003/0201462 A1 * | 10/2003 | Pommer et al. ............... | 257/200 |
| 2004/0264884 A1 | 12/2004 | Liu | |
| 2006/0072882 A1 * | 4/2006 | Casati et al. ................... | 385/92 |
| 2007/0053627 A1 * | 3/2007 | Hsu ................................ | 385/14 |
| 2007/0102777 A1 * | 5/2007 | Davuluri et al. .............. | 257/432 |
| 2008/0044127 A1 * | 2/2008 | Leising et al. ................. | 385/14 |
| 2008/0298818 A1 * | 12/2008 | Epitaux et al. ................ | 398/212 |

OTHER PUBLICATIONS

Chiarulli et al., "Active Substrates for Optoelectronic Interconnect", pp. 1-4.

* cited by examiner

*Primary Examiner* — Mark Robinson
*Assistant Examiner* — Hung Lam
(74) *Attorney, Agent, or Firm* — Yee & Associates, P.C.; Anne Dougherty (57) ABSTRACT

An optical module. The optical module includes an opto-chip. The opto-chip includes an integrated circuit with optical windows and a plurality of optoelectronic devices positioned in alignment with the optical windows. The plurality of optoelectronic devices are flip chip attached to the integrated circuit.

20 Claims, 9 Drawing Sheets

OPTICAL TRANSCEIVER MODULE WITH OPTICAL WINDOWS

This invention was made with Government support under Contract No.: MDA972-03-3-0004 awarded by Defense Advanced Research Projects Agency (DARPA). The Government has certain rights in this invention.

BACKGROUND OF THE INVENTION

1. Field of the Invention

The present invention relates generally to an improved data processing system. More specifically, the present invention is directed to an optical transceiver module with optical windows for flip-chip attached optoelectronic devices.

2. Description of the Related Art

Today, commercial parallel optical modules are based on industry-standard 850 nanometer (nm) wavelength vertical cavity surface emitting laser (VCSEL) and photodiode optoelectronic (OE) devices. Typically, arrays of these OE devices are fabricated on a semiconductor substrate, such as gallium arsenide (GaAs) or indium phosphide (InP), which are low-cost materials. Optical input and output is directed to and from the top surface of the semiconductor substrate because GaAs and InP substrates are not transparent to a wavelength at substantially 850 nm.

Typically, 850 nm wavelength OE devices are packaged in a side-by-side configuration. That is, the OEs are electrically interconnected to driver integrated circuits (ICs) either by wire bonds or through an intermediate electrical carrier. Then, the ICs may be connected to the next level package either by additional wire bonds or through additional wiring on the intermediate electrical carrier. As a result, existing packaging solutions may be complex, costly, and limited in high speed performance due to electrical packaging parasitics.

SUMMARY OF THE INVENTION

Illustrative embodiments provide an improved optical module. The optical module includes an opto-chip. The opto-chip includes an integrated circuit with optical windows and a plurality of optoelectronic devices positioned in alignment with the optical windows. The plurality of optoelectronic devices are flip chip attached to the integrated circuit.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
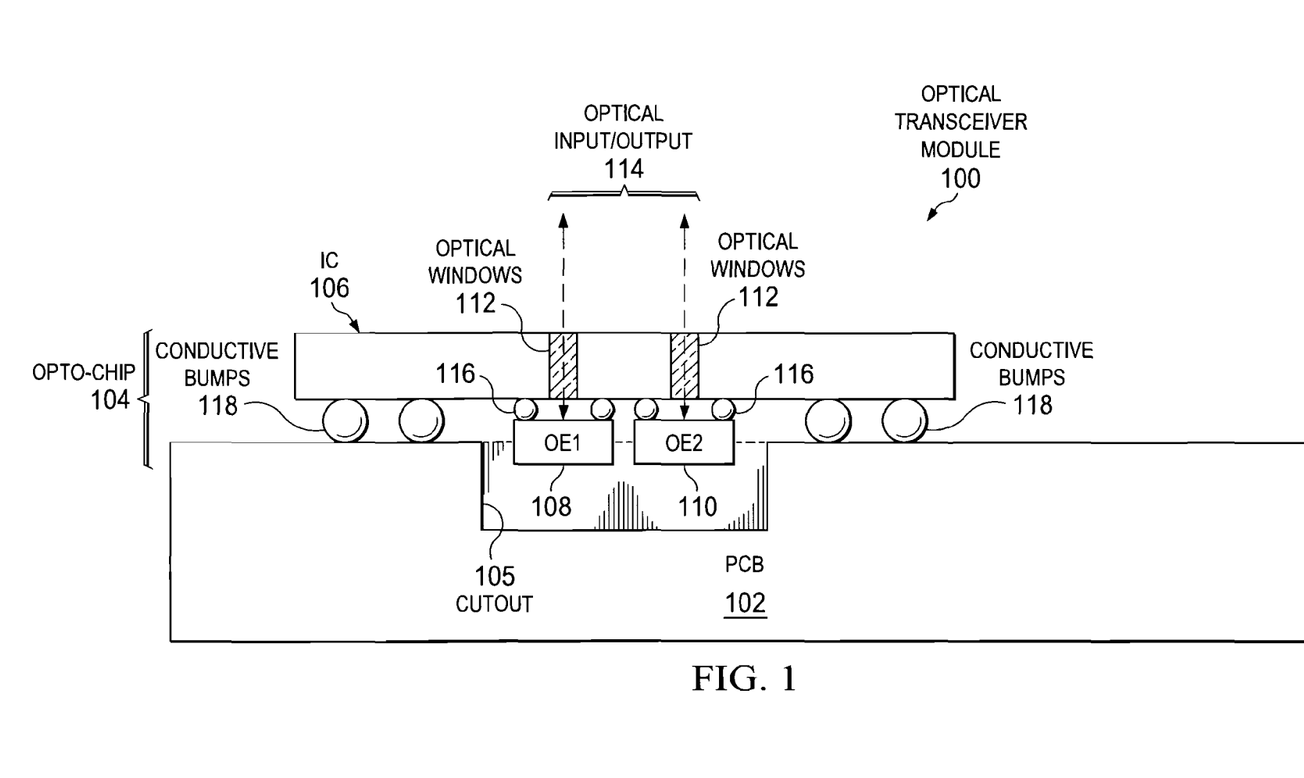
FIG. 1 is a block diagram of a side edge view of an optical transceiver module in accordance with an illustrative embodiment.

With reference now to the figures and in particular with reference to FIG. 1, an exemplary block diagram of an optical module apparatus is provided in which illustrative embodiments may be implemented. It should be appreciated that FIG. 1 is only exemplary and is not intended to assert or imply any limitation with regard to different illustrative embodiments. Many modifications to the depicted optical module apparatus may be made.

FIG. 1 depicts a block diagram of a side edge view of an optical transceiver module in accordance with an illustrative embodiment. Optical transceiver module 100 is an electrical and optical component that is capable of transmitting and receiving pulses of light, which are used to communicate data. Optical transceiver module 100 includes printed circuit board (PCB) 102 and opto-chip 104.

PCB 102 mechanically supports and electronically connects electronic components, such as opto-chip 104, to other electronic components. PCB 102 may, for example, be an organic carrier, which is similar to conventional chip carriers. PCB 102 may also be a ceramic carrier.

PCB 102 includes cutout 105. Cutout 105 is an area that is cutout of PCB 102 and is devoid of structure. Cutout 105 is used to accommodate a portion or all of the structure of opto-chip 104. Also, it should be noted that cutout 105 does not penetrate all the way through PCB 102. In other words, cutout 105 does not create a hole through PCB 102.

Typically, cutout 105 is a square or rectangular area bordered by PCB 102 on all four sides and on the bottom. However, it should be noted that cutout 105 may be any regular or irregular geometric shape and may not be entirely bordered by PCB 102. For example, cutout 105 may only be bordered by PCB 102 on three sides or two sides depending on whether cutout 105 is on an edge or a corner of PCB 102.

Opto-chip 104 is a chip-like device that is flip chip attached to PCB 102. Flip chip offers increased high speed electrical performance. Flip chip is one type of surface mount technology (SMT) used for semiconductor devices that does not require wire bonds. Eliminating bond wires may reduce the delaying inductance and capacitance of a connection by a factor of ten and may shorten an electrical path by a factor of 25 to 100. The result is a higher speed interconnection.

Opto-chip 104 includes IC 106. It should be noted that even though only one IC is shown in this exemplary illustration, IC 106 may also represent a plurality of ICs. IC 106 is a single transceiver IC that includes both a transmitter component and a receiver component. The transmitter component of IC 106 may, for example, be a complementary metal-oxide-semiconductor (CMOS) laser driver. The receiver component of IC 106 may, for example, be a CMOS receiver chip.

Opto-chip 104 also includes OE 1 108 and OE 2 110. It should be noted that OE 1 108 and OE 2 110 may represent 1×N arrays of OE devices, where N may equal any positive whole number. In addition, OE 1 108 and OE 2 110 may represent different types of OE devices.

In this exemplary illustration, OE 1 108 is a VCSEL. As a result, opto-chip 104 uses OE 1 108 as a transmitter to output pulses of light. In addition, OE 2 110 is a photodiode. As a result, opto-chip 104 uses OE 2 110 to receive light pulses as input. Consequently, transceiver IC 106 acts as a laser driver, such as a CMOS laser driver, to modulate the output of light pulses from OE 1 108 to represent ones and zeros for communicating data. Further, transceiver IC 106 acts as a receiver chip, such as a CMOS receiver chip, to convert received light pulses from OE 2 110 into electrical signals.

In an alternative illustrative embodiment, IC 106 may either act as a transmitter or as a receiver depending on the type of OE devices attached to IC 106. For example, OE 1 108 and OE 2 110 may represent a 2×N array of the same type of OE device. As a result, if OE 1 108 and OE 2 110 are both VCSELs, then IC 106 is a laser driver and acts as a transmitter. Similarly, if OE 1 108 and OE 2 110 are both photodiodes, then IC 106 is a receiver chip and acts as a receiver.

OE 1 108 and OE 2 110 are positioned over optical windows 112. Optical windows 112 are small, vertical vias or holes through IC 106. Optical windows 112 allow optical input/output 114 to pass through IC 106 to and from OE 1 108 and OE 2 110. Optical input/output 114 represents light pulses to and from optical circuits or fibers.

OE 1 108 and OE 2 110 electronically connect to IC 106 via conductive bumps 116. Similarly, IC 106 electronically connects to PCB 102 via conductive bumps 118. Conductive bumps 116 and 118 may, for example, be solder bumps, gold balls, molded studs, or electrically conductive plastics. Conductive bumps 116 and 118 connect directly to the associated external circuitry. This type of mounting is also known as the Controlled Collapse Chip Connection, or C4. In addition, this type of mounting leaves a small space between the chip's circuitry and the underlying substrate or mounting.

An electrically-insulating adhesive may be "under filled" in this small space to provide a stronger mechanical connection, provide a heat bridge, and to ensure conductive bumps 116 and 118 are not stressed due to differential heating of opto-chip 104 and PCB 102. The resulting completed assembly (i.e., optical transceiver module 100) is much smaller than a traditional carrier-based system, both in terms of area and height, because opto-chip 104 sits directly on PCB 102.

Thus, illustrative embodiments provide flip chip attachment of 2×N or 1×N arrays of 850 nm wavelength OE devices directly onto a transceiver or driver/amplifier IC chip. The IC chip includes optical windows or vias under each OE device, such that input and output light pulses are directed through the backside of the driver/amplifier IC chip. Conductive bumps or peripheral pads on the IC are used to flip chip attach the IC to an organic or ceramic carrier.

As a result, illustrative embodiments produce low cost, small footprint, parallel optical transmitters, receivers, or transceivers based on 850 nm wavelength OE devices. The exclusive use of flip chip packaging to attach the OE devices to the driver/amplifier IC and the driver/amplifier IC to an organic or ceramic substrate minimizes both the footprint of the assembled optical transceiver module and the parasitic inductance and capacitance incurred in the connections between components. Consequently, illustrative embodiments allow production of optical transceiver modules with a plurality of parallel channels. Further, illustrative embodiments maximize the speed that may be obtained for each individual channel within the plurality of parallel channels, such as, for example, greater than ten gigabits per second (Gb/s).

The IC chip may be fabricated using a standard CMOS fabrication process. An area, which does not contain circuitry, is reserved for the optical windows. Typically, the optical windows are circular areas with diameters of 10 to 500 micrometers (um). Preferably, the area reserved for the optical windows is near the center of the IC chip. Laser driver and photodiode receiver circuits my be designed with output bumps or pads near the optical windows. Peripheral conductive bumps or pads are provided for attachment of the IC chip to the organic or ceramic substrate. These peripheral attachment points are used to transmit electrical input and output signals to and from the IC chip. Typically, these conductive bumps or pads are 100 um on a 200 um pitch or 75 um on a 150 um pitch.

Once standard CMOS fabrication of the IC chip is completed, additional processing of the wafer is used to fabricate the optical windows. Standard lithographic processes, such as, for example, photoresist application and photo exposure, are used to define the optical windows. The optical widows may typically have diameters in the range of 10 to 500 um. Reactive ion etching (RIE) is used to etch nearly cylindrical features in the silicon to a depth of 10 to 500 um. Backside grinding of the silicon wafer is used to thin the wafer to 10-500 um to expose the optical windows.

Then, arrays of OE devices, such as VCSELs and photodiodes, are directly flip chip attached to the IC chip using the OE attach pads on the IC near the optical windows. The OE devices are positioned in alignment with the optical windows on the IC chip. A Gold-Tin (AuSn) solder alloy may, for example, be used for this flip chip attachment. The OE-IC assembly or opto-chip is then flip chip attached using the peripheral conductive bumps or pads to the organic or ceramic carrier. The organic or ceramic carrier may, for example, provide a conventional ball grid array (BGA) of bond pads on the bottom surface for surface mounting to a conventional FR4 system PCB. Furthermore, lenses may be integrated into the backside of the IC chip over the optical windows to provide efficient optical coupling between the OE devices and optical fibers or waveguides.

Figure 2:
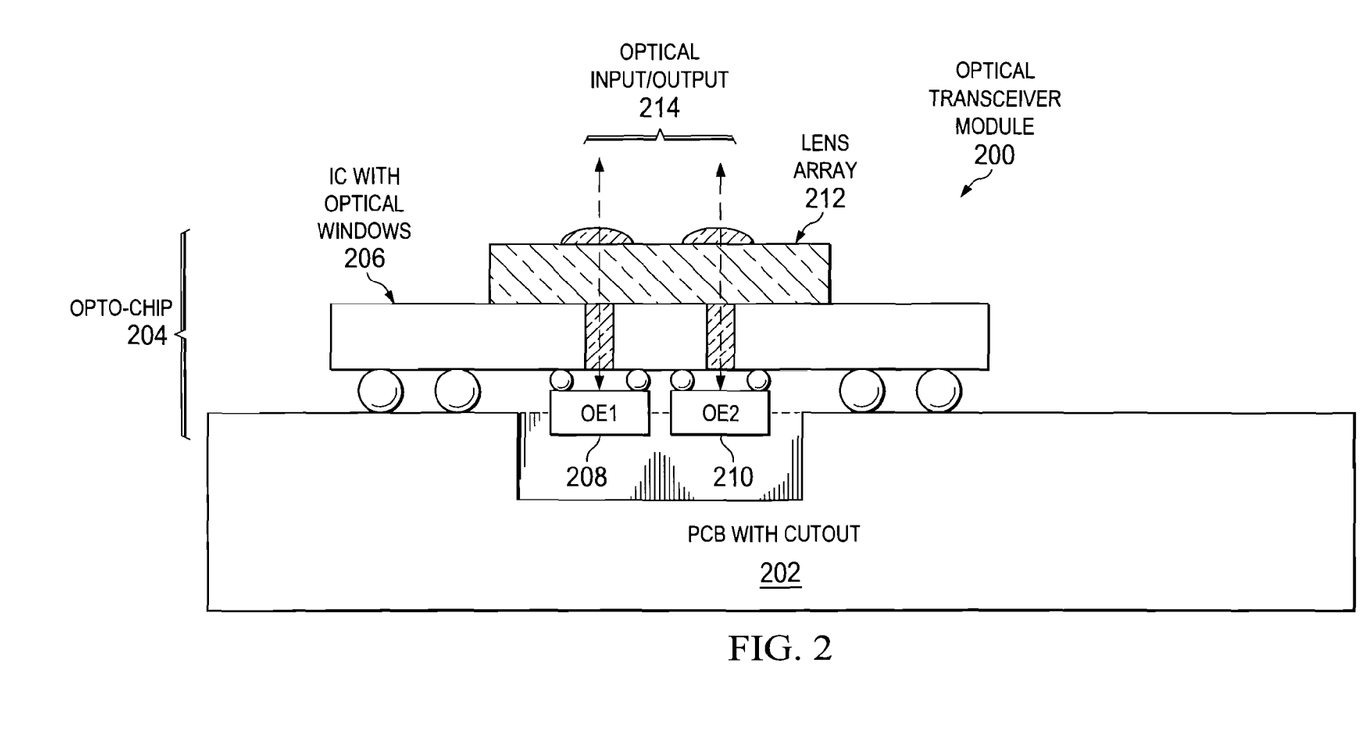
FIG. 2 is a block diagram of a side edge view of an opto-chip with an integrated lens array in accordance with an illustrative embodiment.

With reference now to FIG. 2, a block diagram of a side edge view of an opto-chip with an integrated lens array is depicted in accordance with an illustrative embodiment. Optical transceiver module 200 may, for example, be optical transceiver module 100 in FIG. 1. Optical transceiver module 200 includes PCB with cutout 202 and opto-chip 204.

Opto-chip 204 includes IC with optical windows 206 and OE 1 208 and OE 2 210. OE 1 208 and OE 2 210 are positioned in alignment with the optical windows in IC with optical windows 206. Opto-chip 204 also includes lens array 212. Lens array 212 is located on the "backside" of IC with optical windows 206, whereas OE 1 208 and OE 2 210 are located on the "front side". The "backside" of IC with optical windows 206 does not contain any active circuitry, whereas the "front side" does include active circuitry.

Lens array 212 is an array of integrated lens that also are positioned in alignment with the optical windows. The number of integrated lens within lens array 212 may or may not correspond with the number of OE devices flip chip attached to IC with optical windows 206. Lens array 212 provides more efficient optical coupling between OE 1 208 and OE 2 210 and optical fibers or optical circuits. In addition, lens array 212 may provide for greater coupling distances between OE 1 208 and OE 2 210 and the optical fibers or circuits by focusing the pulses of light to the OEs. Optical input/output 214 represents the pulses of light that are focused through lens array 212 to and from OE 1 208 and OE 2 210.

Figure 3:
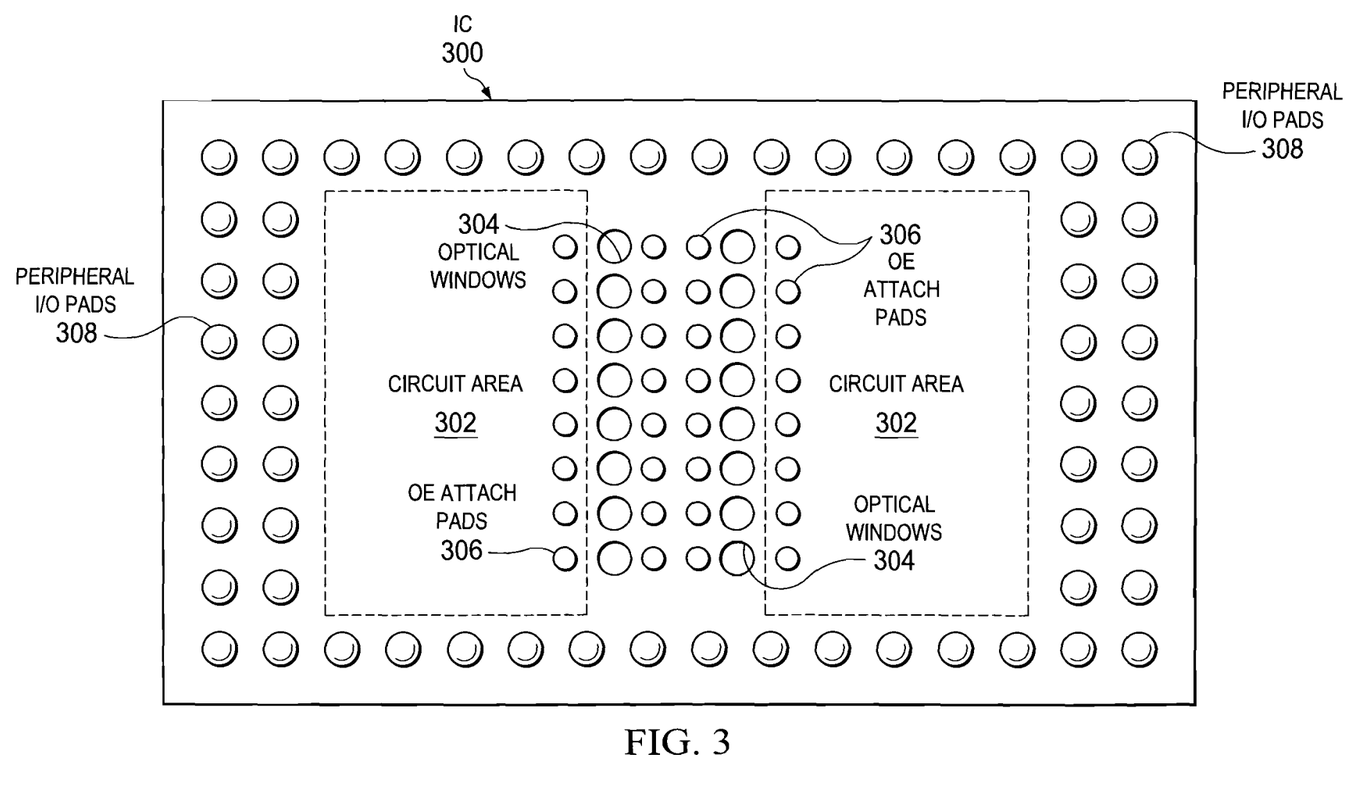
FIG. 3 is an illustration of a top view of an integrated circuit with optical windows in accordance with an illustrative embodiment.

With reference now to FIG. 3, an illustration of a top view of an integrated circuit with optical windows is depicted in accordance with an illustrative embodiment. It should be noted that FIG. 3 illustrates a top view of the "front side" of IC 300. IC 300 may, for example, be IC 106 in FIG. 1. IC 300 includes circuit area 302, optical windows 304, OE attach pads 306, and peripheral I/O pads 308.

Circuit area 302 includes the active circuitry for one or more laser drivers and/or one or more photodiode receivers. In addition, circuit area 302 may also contain other types of circuitry in addition to the laser drivers and photodiode receivers. For example, circuit area 302 may also include decoupling capacitors, resistors, inductors, and/or integrated active devices, such as voltage regulators, memory circuits, or other active circuits. The voltage regulators may, for example, provide the ability to regulate or segment voltages to each OE flip chip attached to IC 300 to support multiple voltage levels. In addition, the voltage regulators may also provide an ability to power on and off OEs individually.

The type of active circuitry within circuit area 302 depends on the type of OE devices flip chip attached to IC 300. For example, if the OEs are VCSELs, then the active circuits within circuit area 302 include laser drivers. Alternatively, if the OEs are photodiodes, then the active circuits within circuit area 302 include photodiode receivers. However, if the OEs are a mixture of VCSELs and photodiodes, then the active circuits within circuit area 302 include both laser drivers and photodiode receivers.

Optical windows 304 may, for example, be optical windows 112 in FIG. 1. In this illustrative example, optical windows 304 are in a 2×8 array. However, it should be noted that illustrative embodiments are not restricted to such. Illustrative embodiments may use any type of array, such as, for example, 1×N, 2×N, 4×N, 6×N, 8×N, et cetera. Typically, the number of optical windows 304 will correspond to the number of OE devices flip chip attached to IC 300.

OE attach pads 306 may, for example, be conductive bumps 116 in FIG. 1. OE attach pads 306 provide for the flip chip attachment of OEs, such as OE 1 108 and OE 2 110 in FIG. 1, to IC 300. Typically, one OE attach pad is located on each side of an optical window. Alternatively, both OE attach pads may be located on the same side of the optical window.

Peripheral I/O pads 308 may, for example, be conductive bumps 118 in FIG. 1. Peripheral I/O pads 308 provide for the flip chip attachment of IC 300 to an organic or ceramic substrate, such as, for example, PCB 102 in FIG. 1. In addition, peripheral I/O pads 308 are used to transmit and receive electrical input/output signals between IC 300 and the organic or ceramic substrate.

Figure 4:
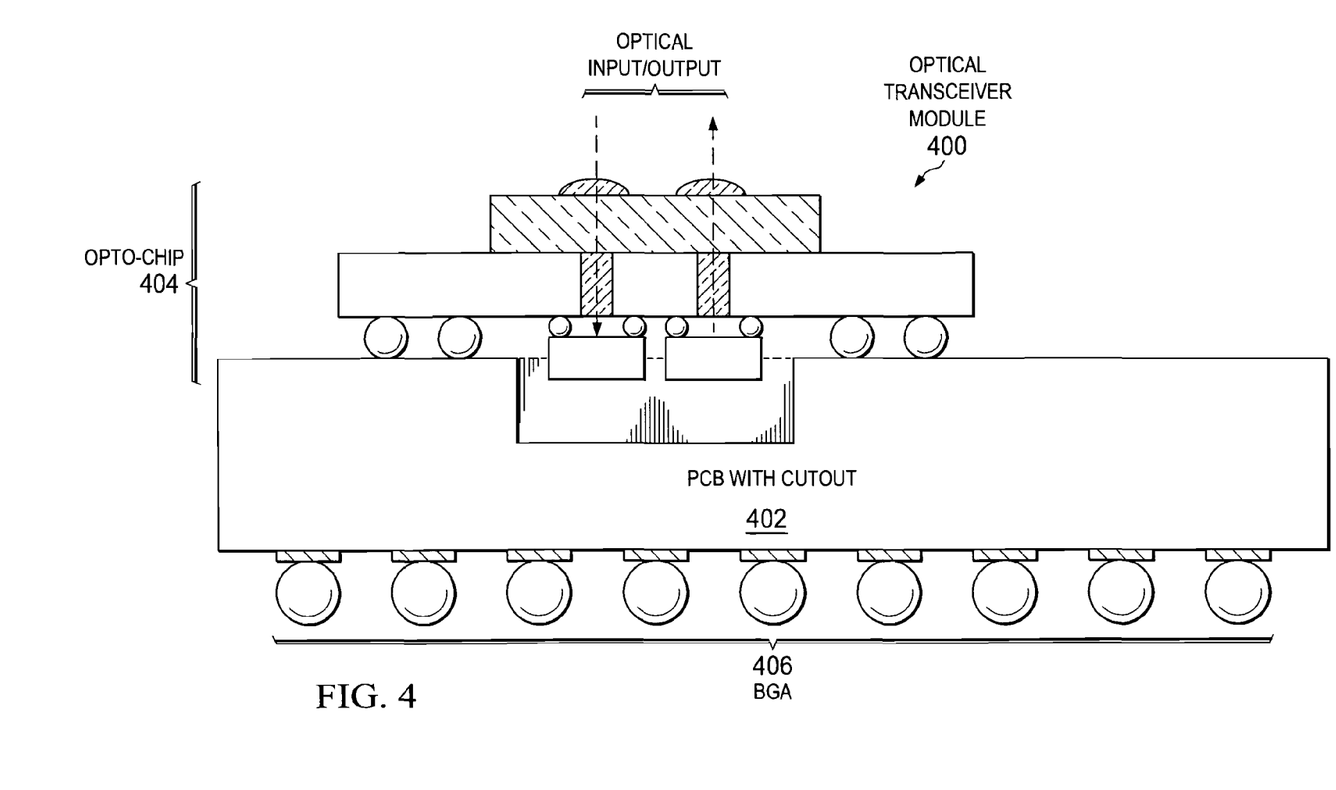
FIG. 4 is a block diagram of a side edge view of an optical transceiver module with a ball grid array in accordance with an illustrative embodiment.

With reference now to FIG. 4, a block diagram of a side edge view of an optical transceiver module with a ball grid array is depicted in accordance with an illustrative embodiment. Optical transceiver module 400 may, for example, be optical transceiver module 200 in FIG. 2. Optical transceiver module 400 includes PCB with cutout 402 and opto-chip 404, such as PCB with cutout 202 and opto-chip 204 in FIG. 2. PCB with cutout 402 includes BGA 406. BGA 406 is an array of bond pads or conductive bumps on the bottom surface of PCB with cutout 402 for surface mounting optical transceiver module 400 to, for example, a system PCB, such as a motherboard.

Figure 5:
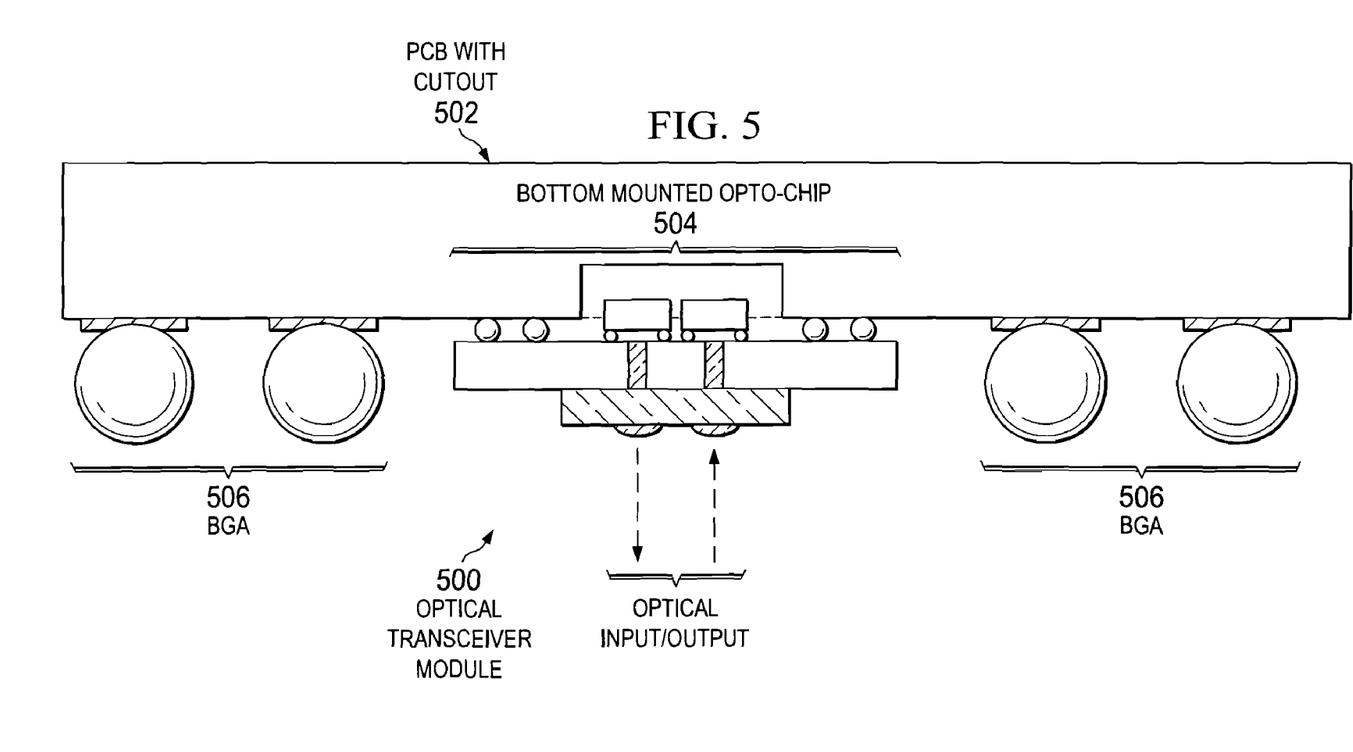
FIG. 5 is a block diagram of a side edge view of an optical transceiver module with a bottom mounted opto-chip in accordance with an illustrative embodiment.

With reference now to FIG. 5, a block diagram of a side edge view of an optical transceiver module with a bottom mounted opto-chip is depicted in accordance with an illustrative embodiment. Optical transceiver module 500 may, for example, be optical transceiver module 400 in FIG. 4. Optical transceiver module 500 includes PCB with cutout 502 and bottom mounted opto-chip 504. It should be noted that bottom mounted opto-chip 504 is flip chip attached to the bottom side of PCB with cutout 502, whereas opto-chip 404 is flip chip attached to the top side of PCB with cutout 402 in FIG. 4.

PCB with cutout 502 includes a cutout area on the bottom side to accommodate a portion of bottom mounted opto-chip 504. In addition, PCB with cutout 502 also includes BGA 506, such as BGA 406 in FIG. 4. However, it should be noted that BGA 506 does not extend into the center area on the bottom side of PCB with cutout 502 where bottom mounted opto-chip 504 is located. In addition, BGA 506 may comprise relatively larger conductive balls, as compared to BGA 406 in FIG. 4, in order to accommodate bottom mounted opto-chip 504 between optical transceiver module 500 and a system PCB.

Figure 6:
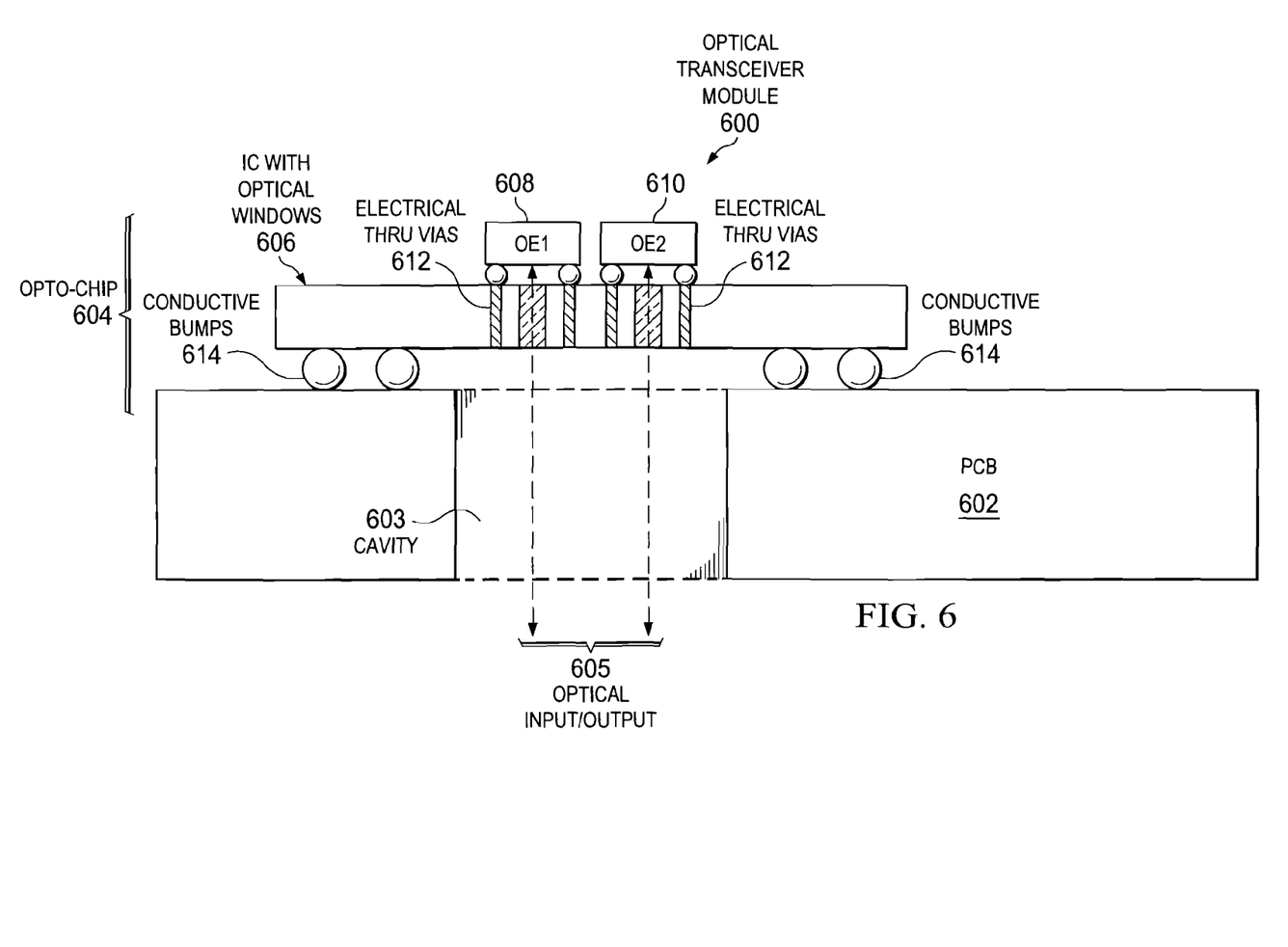
FIG. 6 is a block diagram of a side edge view of an opto-chip with backside mounted optoelectronic devices in accordance with an illustrative embodiment.

With reference now to FIG. 6, a block diagram of a side edge view of an opto-chip with backside mounted optoelectronic devices is depicted in accordance with an illustrative embodiment. Optical transceiver module 600 includes PCB 602 and opto-chip 604. PCB 602 includes cavity 603, which is a hole cut through PCB 602. Cavity 603 allows optical input/output 605 to pass through PCB 602 to a front side of IC with optical windows 606.

Opto-chip 604 includes IC with optical windows 606, OE 1 608, and OE 2 610. It should be noted that OE 1 608 and OE 2 610 are located on the backside of IC with optical windows 606. In contrast, OE 1 108 and OE 2 110 are located on the front side of IC 106 in FIG. 1.

Opto-chip 606 also includes electrical thru vias 612. Electrical thru vias 612 are small, vertical holes etched through IC with optical windows 606. Typically, one electrical thru via is located on each side of an optical window, which is similar to the positioning of OE attach pads 306 adjacent to optical windows 304 in FIG. 3. RIE may, for example, be used to etch electrical thru vias 612. In addition, electrical thru vias 612 may be filled with a metal, such as copper (Cu) or tungsten (W), or some other type of conductive material.

Electrical thru vias 612 electrically connect OE 1 608 and OE 2 610 to a circuit area on the front side of IC with optical windows 606, such as circuit area 302 on the front side of IC 300 in FIG. 3. Thus, electrical thru vias 612 allow OE 1 608 and OE 2 610 to be packaged on the backside of IC with optical windows 606.

In an alternative embodiment, OE 1 608 and OE 2 610 are located on the front side of IC with optical windows 606, which contains the circuit area. In other words, in this alternative embodiment the circuit area on the front side of IC with optical windows 606 now faces away from PCB 602. In contrast, the circuit area of IC 106 faces toward PCB 102 in FIG. 1. Thus, opto-chip 604 is now flip chip attached "upside-down" to PCB 602 in relation to opto-chip 104 in FIG. 1. As a result, conductive bumps 614, such as peripheral I/O pads 308 in FIG. 3, are located on the backside of IC with optical windows 606 instead of the front side as illustrated in FIG. 3. OE 1 608 and OE 2 610 electrically connect to the backside of IC with optical windows 606 via electrical thru vias 612, which are now vertically positioned over conductive bumps 614. OE 1 608 and OE 2 610 now electrically connect to electrical thru vias 612, which are repositioned over conductive bumps 614, via surface wiring.

Figure 7:
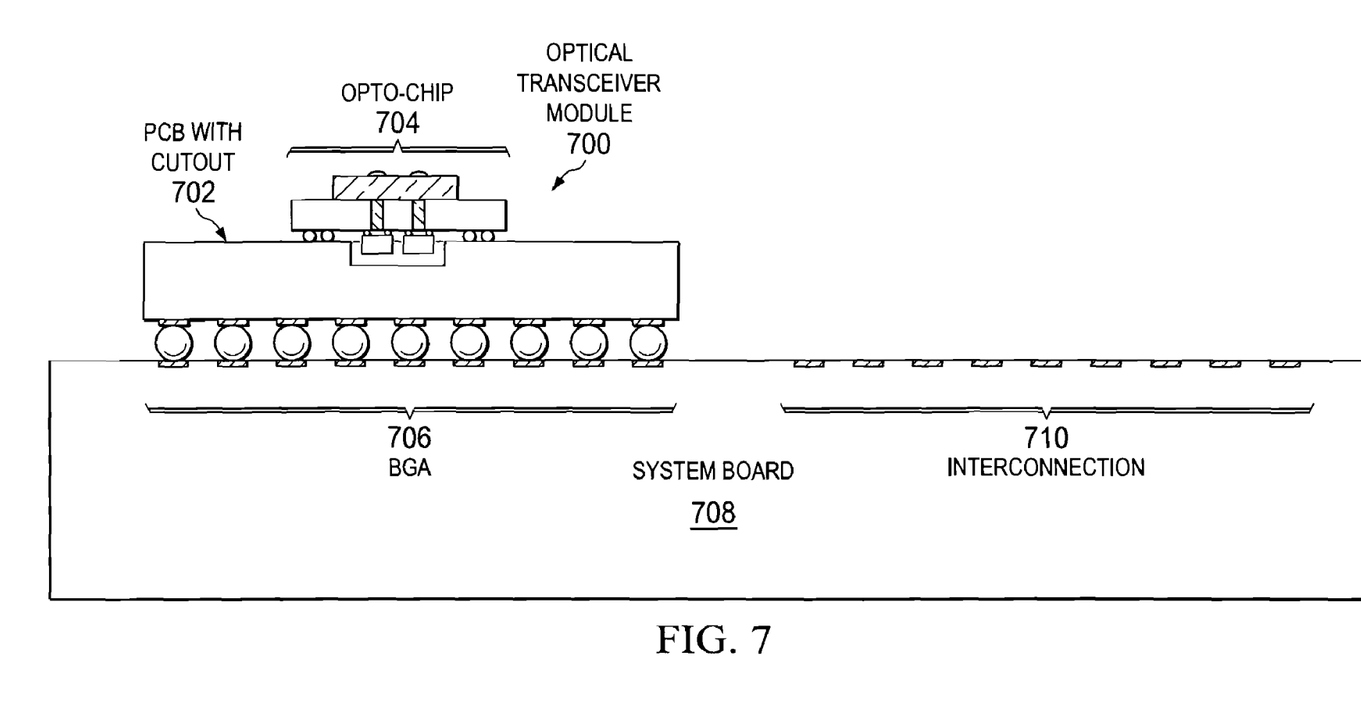
FIG. 7 is a block diagram of a side edge view of an optical transceiver module attached to a system board in accordance with an illustrative embodiment.

With reference now to FIG. 7, a block diagram of a side edge view of an optical transceiver module attached to a system board is depicted in accordance with an illustrative embodiment. Optical transceiver module 700 may, for example, be optical transceiver module 400 in FIG. 4. Optical transceiver module 700 includes PCB with cutout 702 and opto-chip 704. PCB 702 includes BGA 706. BGA 706 is used to surface mount optical transceiver module 700 onto system board 708. System board 708 may, for example, be a motherboard.

System board 708 includes interconnection 710. Interconnection 710 may comprise conductive bumps or pads. Alternatively, interconnection 710 may comprise sockets for receiving pin interconnections. In addition, interconnection 710 may represent a plurality of interconnection sites on system board 708. Interconnection 710 is used to attach other modules or chips to system board 708.

Figure 8:
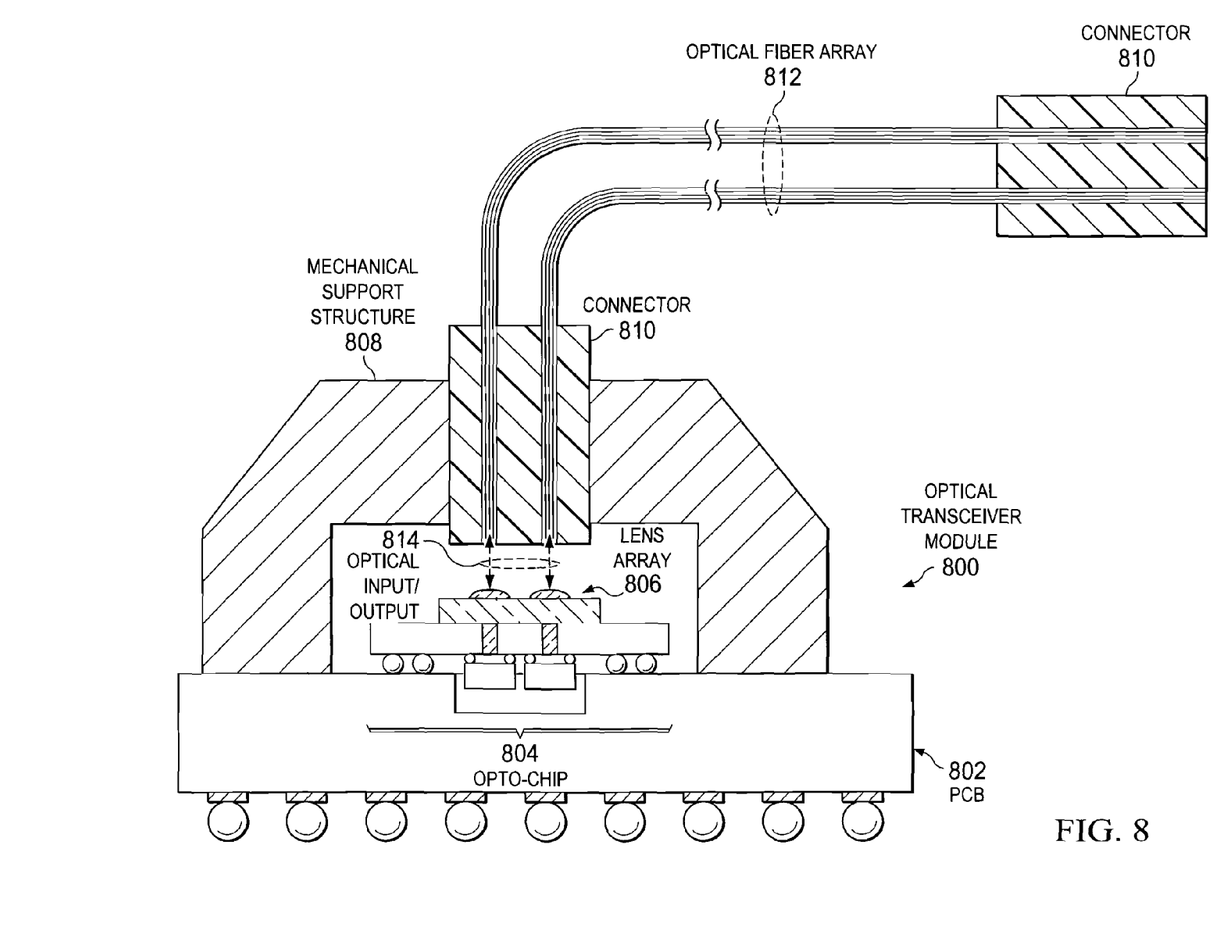
FIG. 8 is a block diagram of a side edge view of an optical transceiver module with an attached optical fiber array in accordance with an illustrative embodiment.

With reference now to FIG. 8, a block diagram of a side edge view of an optical transceiver module with an attached optical fiber array is depicted in accordance with an illustrative embodiment. Optical transceiver module 800 may, for example, be optical transceiver module 400 in FIG. 4. Optical transceiver module 800 includes PCB 802 and opto-chip 804. Opto-chip 804 includes lens array 806, such as lens array 212 in FIG. 2.

Mechanical support structure 808 is attached to PCB 802. Mechanical support structure 812 is an apparatus that is used to support and hold connector 810. Connector 810 is located at each end of optical fiber array 812. Connector 810 is used to physically connect or fasten optical fiber array 812 to mechanical support structure 808. Mechanical support structure 808 also is used to align optical fiber array 812 over lens array 806. Optical fiber array 812 may, for example, be a 2×N array of optical fibers for transmitting and receiving pulses of light, such as optical input/output 814, which communicate data to and from opto-chip 804 via lens array 806.

Figure 9:
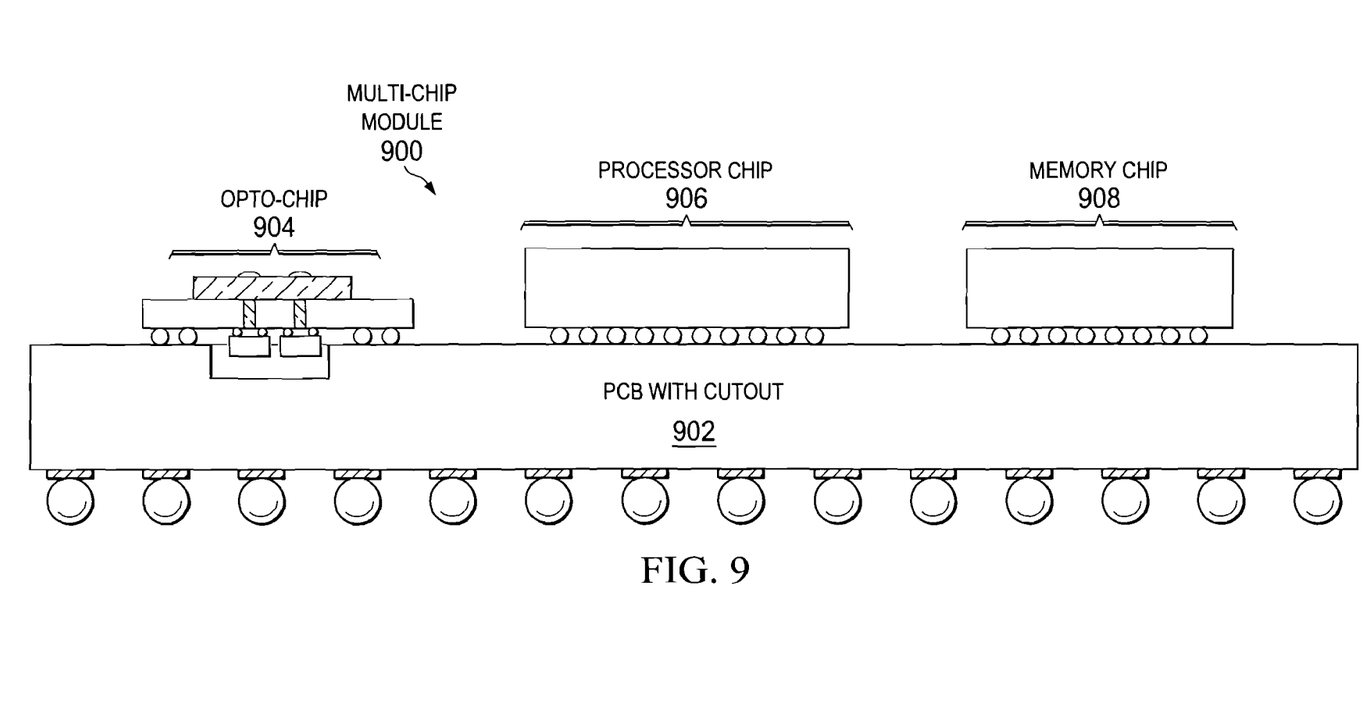
FIG. 9 is a block diagram of a side edge view of a multi-chip module in accordance with an illustrative embodiment.

With reference now to FIG. 9, a block diagram of a side edge view of a multi-chip module is depicted in accordance with an illustrative embodiment. Multi-chip module 900 is a module that incorporates the functionality of a plurality of electronic chips or devices. Multi-chip module 900 includes PCB with cutout 902 and opto-chip 904, such as PCB with cutout 702 and opto-chip 704 in FIG. 7.

In addition, multi-chip module 900 also includes processor chip 906 and memory chip 908. However, it should be noted that FIG. 9 is only shown as an exemplary illustration of a multi-chip module and is not meant as a limitation to illustrative embodiments. Consequently, multi-chip 900 may include more or fewer chips. Moreover, multi-chip 900 may include other types of chips in addition to, or instead of, processor chip 906 and memory chip 908. Further, it should be noted that opto-chip 904, processor chip 906, and memory chip 908 are interconnected via wiring (not shown in the example of FIG. 9) on PCB with cutout 902.

Thus, illustrative embodiments provide an improved optical transceiver module. The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An optical module comprising:
   an integrated circuit fabricated on a silicon wafer, the integrated circuit having at least one optical window there through, wherein the at least one optical window is at least one hole that allows light pulses to pass through the at least one optical window of the integrated circuit;
   a plurality of optoelectronic devices positioned in alignment with the at least one optical window such that optical input or optical output from the plurality of optoelectronic devices can pass through the at least one optical window of the integrated circuit, wherein the plurality of optoelectronic devices are flip chip attached to the integrated circuit;
   a carrier having a cutout therein, wherein the carrier is flip chip attached to the integrated circuit, wherein the cutout is used to accommodate the plurality of optoelectronic devices.

2. The optical module of claim 1, wherein the carrier is one of an organic substrate or a ceramic substrate.

3. The optical module of claim 1, wherein the integrated circuit is flip chip attached to a top side of the carrier.

4. The optical module of claim 1, wherein the integrated circuit is a transceiver integrated circuit.

5. The optical module of claim 1, wherein the integrated circuit is flip chip attached to a bottom side of the carrier.

6. The optical module of claim 1, wherein the plurality of optoelectronic devices are flip chip attached to a front side of the integrated circuit.

7. The optical module of claim 1, wherein the plurality of optoelectronic devices are flip chip attached to a back side of the integrated circuit.

8. The optical module of claim 7, wherein the plurality of optoelectronic devices flip chip attached to the back side of the integrated circuit are electrically connected to a front side of the integrated circuit via electrical thru vias.

9. The optical module of claim 6, wherein the front side of the integrated circuit includes active circuitry.

10. The optical module of claim 9, wherein the active circuitry is one or more laser drivers and one or more photodiode receivers.

11. The optical module of claim 1, wherein the at least one optical window is at least one small cylindrical hole that allows light pulses to pass through the integrated circuit to the plurality of optoelectronic devices.

12. The optical module of claim 1, wherein the carrier includes a cavity that allows light pulses to pass through the carrier to the at least one optical window in the integrated circuit.

13. The optical module of claim 1, wherein the plurality of optoelectronic devices include vertical cavity surface emitting lasers and photodiodes.

14. The optical module of claim 1, wherein the plurality of optoelectronic devices operate at a laser wavelength of 850 nanometers.

15. The optical module of claim 1, further comprising:
a plurality of chips attached to the integrated circuit, wherein the plurality of chips provide a plurality of different functions.

16. The optical module of claim 1, further comprising a lens array attached to a back side of the integrated circuit to provide efficient optical coupling between the plurality of optoelectronic devices and an optical fiber array.

17. The optical module of claim 1, further comprising:
a first set of conductive bumps for flip chip attachment of the integrated circuit to the carrier; and
a second set of conductive bumps for flip chip attachment of the plurality of optoelectronic devices to the integrated circuit, wherein a pitch for the second set of conductive bumps is less than a pitch for the first set of conductive bumps.

18. The optical module of claim 1, wherein the integrated circuit is a transmitter integrated circuit with laser driver active circuitry, and wherein the plurality of optoelectronic devices are vertical cavity surface emitting lasers.

19. The optical module of claim 1, wherein the integrated circuit is a receiver integrated circuit with photodiode receiver active circuitry, and wherein the plurality of optoelectronic devices are photodiodes.

20. The optical module of claim 1, wherein the at least one optical window is created in the silicon wafer using processes selected from photoresist application to the silicon wafer, photo exposure of the silicon wafer, reactive ion etching of the silicon wafer, backside grinding of the silicon wafer, and combinations thereof.

* * * * *